US009727667B2

(12) United States Patent
Cockburn et al.

(10) Patent No.: US 9,727,667 B2
(45) Date of Patent: Aug. 8, 2017

(54) GENERATING A THREE DIMENSIONAL BUILDING MANAGEMENT SYSTEM

(71) Applicant: Honeywell International Inc., Morristown, NJ (US)

(72) Inventors: Mark Cockburn, Collaroy (AU); Richard Denning, Macquarie Park (AU); Shailesh Rasane, Parramatta (AU); Henry Chen, Beijing (CN); Tom Plocher, Hugo, MN (US); Conrad B. Beaulieu, Duluth, MN (US); Liana M. Kiff, Minneapolis, MN (US)

(73) Assignee: Honeywell International Inc., Morris Plains, NJ (US)

( * ) Notice: Subject to any disclaimer, the term of this patent is extended or adjusted under 35 U.S.C. 154(b) by 282 days.

(21) Appl. No.: 13/914,318

(22) Filed: Jun. 10, 2013

(65) Prior Publication Data
US 2014/0365181 A1    Dec. 11, 2014

(51) Int. Cl.
*G06F 17/50* (2006.01)
*G06T 15/00* (2011.01)
*G06T 17/00* (2006.01)

(52) U.S. Cl.
CPC .......... *G06F 17/5004* (2013.01); *G06T 15/00* (2013.01)

(58) Field of Classification Search
None
See application file for complete search history.

(56) References Cited

U.S. PATENT DOCUMENTS

| | | | |
|---|---|---|---|
| 4,935,879 | A | 6/1990 | Ueda |
| 5,448,696 | A | 9/1995 | Shimada et al. |
| 5,528,735 | A | 6/1996 | Strasnick et al. |
| 5,555,354 | A | 9/1996 | Strasnick et al. |
| 5,850,352 | A | 12/1998 | Moezzi et al. |
| 5,999,185 | A | 12/1999 | Kato et al. |
| 6,078,334 | A | 6/2000 | Hanaoka et al. |
| 6,169,553 | B1 | 1/2001 | Fuller et al. |
| 6,184,891 | B1 | 2/2001 | Blinn |
| 6,198,431 | B1 | 3/2001 | Gibson |
| 6,289,299 | B1 | 9/2001 | Daniel, Jr. et al. |
| 6,346,938 | B1 | 2/2002 | Chan et al. |
| 6,373,489 | B1 | 4/2002 | Lu et al. |
| 6,452,544 | B1 | 9/2002 | Hakala et al. |

(Continued)

OTHER PUBLICATIONS

Asen, "Building Information Modeling Based Integration and Visualization for Facilities Management", Jun. 2012.*

(Continued)

*Primary Examiner* — Yingchun He
(74) *Attorney, Agent, or Firm* — Brooks, Cameron & Huebsch, PLLC

(57) ABSTRACT

Devices, methods, and systems for generating a three dimensional building management system are described herein. One method includes inputting, into a three dimensional graphics rendering engine, building information modeling data associated with a building, inputting, into the three dimensional graphics rendering engine, real time building management system data associated with the building, and generating, by the three dimensional graphics rendering engine, a three dimensional building management system for the building based on the building information modeling data and the real time building management system data.

5 Claims, 2 Drawing Sheets

(56) References Cited

U.S. PATENT DOCUMENTS

| | | |
|---|---|---|
| 6,487,457 B1 | 11/2002 | Hull et al. |
| 6,583,793 B1 | 6/2003 | Gould et al. |
| 6,621,491 B1 | 9/2003 | Baumrind et al. |
| 6,983,227 B1 | 1/2006 | Thalhammer-Reyero |
| 7,383,148 B2 | 6/2008 | Ahmed |
| 7,482,917 B2 | 1/2009 | Rhodes et al. |
| 7,567,844 B2 | 7/2009 | Thomas et al. |
| 2004/0181374 A1 | 9/2004 | Rappaport et al. |
| 2006/0044307 A1* | 3/2006 | Song ............ G06Q 10/06 345/419 |
| 2008/0247636 A1 | 10/2008 | Davis et al. |
| 2009/0307255 A1 | 12/2009 | Park |
| 2010/0070089 A1* | 3/2010 | Harrod ......... F24F 11/0086 700/277 |
| 2010/0121613 A1 | 5/2010 | Rosca et al. |
| 2011/0087988 A1 | 4/2011 | Ray et al. |
| 2011/0209081 A1 | 8/2011 | Chen et al. |
| 2011/0218777 A1 | 9/2011 | Chen et al. |
| 2012/0203806 A1 | 8/2012 | Panushev |
| 2012/0323382 A1* | 12/2012 | Kamel ............... G05F 1/66 700/286 |
| 2013/0085588 A1 | 4/2013 | Brun et al. |
| 2013/0235029 A1* | 9/2013 | Keough ............ G06T 15/40 345/419 |
| 2013/0303193 A1* | 11/2013 | Dharwada ......... H04W 4/043 455/456.3 |
| 2013/0338970 A1* | 12/2013 | Reghetti ......... G06F 17/5004 703/1 |
| 2014/0207774 A1* | 7/2014 | Walter ........... G06F 17/30905 707/736 |

OTHER PUBLICATIONS

Mignard et al. "SIGA3D: A semantic BIM extension to Represent Urban Environment", SEMAPRO2011: The fifth international Conference on Advances n Semantic Processing, 2011.*

Artur Krukowski, et al. Comprehensive Building Information Management System Approach. International Journal of Simulation Systems, Science & Technology, vol. 11, No. 3, pp. 12-28, May 2010.

Andreas Fernbach, et al. Interoperability at the Management Level of Building Automation Systems: A Case Study for BACnet and OPC UA, IEEE ETFA. pp. 1-8. 2011.

Yin, "Building Management System to Support Building Renovation", Department of Civil and Environmental Engineering, UCC, Snapshots of Doctoral Research at University College Cork 2010, pp. 164-169.

* cited by examiner

GENERATING A THREE DIMENSIONAL BUILDING MANAGEMENT SYSTEM

TECHNICAL FIELD

The present disclosure relates to devices, methods, and systems for generating a three dimensional building management system.

BACKGROUND

Building information modeling (BIM) can refer to the generation and/or management of data associated with a building (e.g., data associated with the components, equipment, and/or properties of the building). For example, BIM data can include architectural, mechanical, electrical, plumbing, sanitary, fire, and/or geometrical information associated with a building.

The leading international standard for describing the data contained within a building information model is called the Industry Foundation Classes (IFC), which is an open standard designed and maintained by the BuildingSmartAlliance. This is a very comprehensive standard that provides for the description of data related to many sub-domains related to the design, build, construction, and/or operation of a building.

BIM data associated with a building can be used to generate a user interface for a building management system for the building, which can be displayed to a user (e.g., operator) and used to monitor and/or control the building. For example, the user (e.g., operator) of a building management system can check and/or set the state of a control component(s), equipment, device(s), network (s) area(s), and/or space(s) of the building using the user interface of the building management system. The user interface with multiple views can include, for example, the floor plan of the building, with additional information about the building (e.g., information about a device(s) of the building, information about a control network(s) of the building, schematic graphics of the building, etc.) overlaid on the floor plan. The building management system (e.g., the user interface displayed to the operator) can be two or three dimensional.

The amount of BIM data associated with a building, and codified or expressed in the IFC standard, tends to be proportional to the size of the building, and can grow exponentially based on the number of specific sub-domains that are identified and documented in the BIM, including, for example, plumbing, electrical, or HVAC systems. Therefore, even a small building with very complete information for many different systems within the building may have a very large amount of BIM data associated therewith. Accordingly, a building management system, and in particular a three dimensional building management system, for a building may utilize a large amount of BIM data, which can increase the amount of time and/or computing resources needed to generate the building management system, clutter the user interface of the building management system displayed to the operator (in particular when displayed on a small screen of a mobile device), and/or result in a sluggish interaction between the operator and the building management system. This can have a negative impact on the operator, particularly when the operator has to respond very quickly to some real time change in the status of the building or the equipment therein.

DETAILED DESCRIPTION

Figure 1:
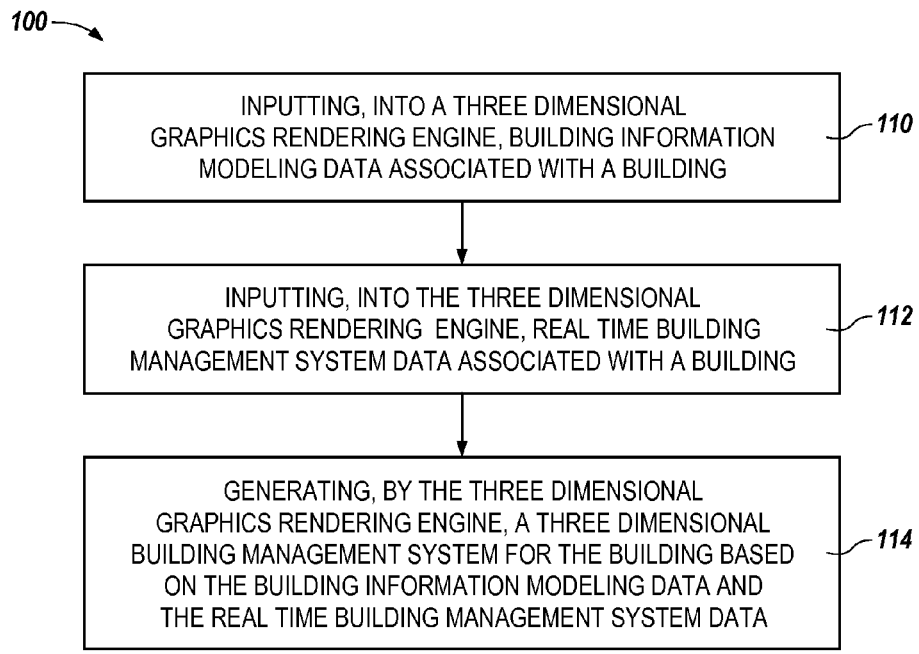
FIG. 1 illustrates a method for generating a three dimensional building management system in accordance with one or more embodiments of the present disclosure.

Devices, methods, and systems for generating a three dimensional building management system are described herein. For example, one or more embodiments include inputting, into a three dimensional graphics rendering engine, building information modeling data associated with a building, inputting, into the three dimensional graphics rendering engine, real time building management system data associated with the building, and generating, by the three dimensional graphics rendering engine, a three dimensional building management system for the building based on the building information modeling data and the real time building management system data.

Embodiments of the present disclosure can decrease the amount of time and/or computing resources needed to generate a three dimensional building management system for a building. Further, three dimensional building management systems generated in accordance with the present disclosure can be less cluttered and/or interact more efficiently with the user of the building management system than building management systems generated in accordance with previous approaches. Further, three dimensional building management systems generated in accordance with the present disclosure can quickly and effectively respond to real time changes in the status of the building and/or the equipment therein.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of components" can refer to one or more buildings.

FIG. 1 illustrates a method 100 for generating (e.g., creating and/or building) a three dimensional (3D) building management system (e.g., a system used to monitor and/or control a building) in accordance with one or more embodiments of the present disclosure. Method 100 can be performed by a computing device, such as, for instance, a laptop computer, a desktop computer, or a mobile device (e.g., a mobile phone, a smart phone, a personal digital assistant, etc.), among other types of computing devices.

At block 110, method 100 includes inputting, into a 3D graphics rendering engine, building information modeling (BIM) data associated with a building. The 3D graphics rendering engine can be, for example, a 3D gaming engine (e.g., a commercial 3D gaming engine such as Unity). However, embodiments of the present disclosure are not limited to a particular 3D graphics rendering engine.

The BIM data associated with the building can include data associated with the components (e.g., control components), equipment, devices, networks (e.g., control networks), areas, spaces, and/or properties of the building. For example, the BIM data can include architectural (e.g., floor plan), mechanical, electrical, plumbing, sanitary, fire, and/or geometrical information associated with the building. In some embodiments, the BIM data can be static data (e.g., data that does not change over time). However, embodiments of the present disclosure are not limited to particular types of BIM data.

In some embodiments, before the BIM data associated with the building is input into the 3D graphics rendering engine, the BIM data can be transposed into a standardized format associated with the 3D graphics rendering engine. The transposed BIM data can then be input into the 3D graphics rendering engine.

At block 112, method 100 includes inputting (e.g., binding), into the 3D graphics rendering engine, real time building management system data associated with the building. The real time building management system data can be the real time (e.g., current operating) state and/or condition of the building's components, equipment, devices, networks, areas, spaces, and/or properties. That is, the real time building management system data can be dynamic data (e.g., data that changes over time as the state and/or condition of the building changes).

At block 114, method 100 includes generating, by the 3D graphics rendering engine, a 3D building management system for the building based on (e.g., by merging) the BIM data and the real time building management system data. The 3D building management system for the building can include, for example, a 3D operational (e.g., graphical) user (e.g., operator) interface that includes, for example, the floor plan of the building, with additional real time information about the building (e.g., real time information about the components, equipment, devices, networks, areas, spaces, and/or properties of the building, schematic graphics of the building, etc.) overlaid on the floor plan. The 3D building management system (e.g., the 3D operational user interface) can be provided (e.g., displayed and/or presented) to a user on a display (e.g., screen) of a computing device (e.g., a laptop computer, a desktop computer, or a mobile device) of the user.

As an example, generating the 3D building management system for the building can include generating, by the 3D graphics rendering engine, a 3D surface from the BIM data and extracting, by the 3D graphics rendering engine, a number of components of the building (e.g., data associated with the components) from the BIM data. The components of the building extracted from the BIM data can be, for example, the components of the building applicable (e.g., relevant) to the 3D building management system (e.g., components of the building not applicable to the 3D building management system may not be extracted from the BIM data by the 3D graphics rendering engine).

The 3D graphics rendering engine can then bind each of the number of components of the building extracted from the BIM data to a corresponding building management system representation of that respective component, and bind the 3D surface generated from the BIM data (e.g., the parameters of the 3D surface) to the building management system representations of the building components. The 3D graphics rendering engine can then update the number of components of the building extracted from the BIM data based on (e.g., relative to) the real time building management system data (e.g., the real time state and/or condition of the extracted building components). Further, the 3D graphics rendering engine can use the real time building management system data to illustrate the changes in the building conditions over time, model the real world (e.g., actual) causes and effects of abnormal building conditions, and/or display a probable (e.g., predicted) sequence of future events, which can improve responsiveness (e.g., operator responsiveness) when responding to the abnormal building conditions.

Figure 2:
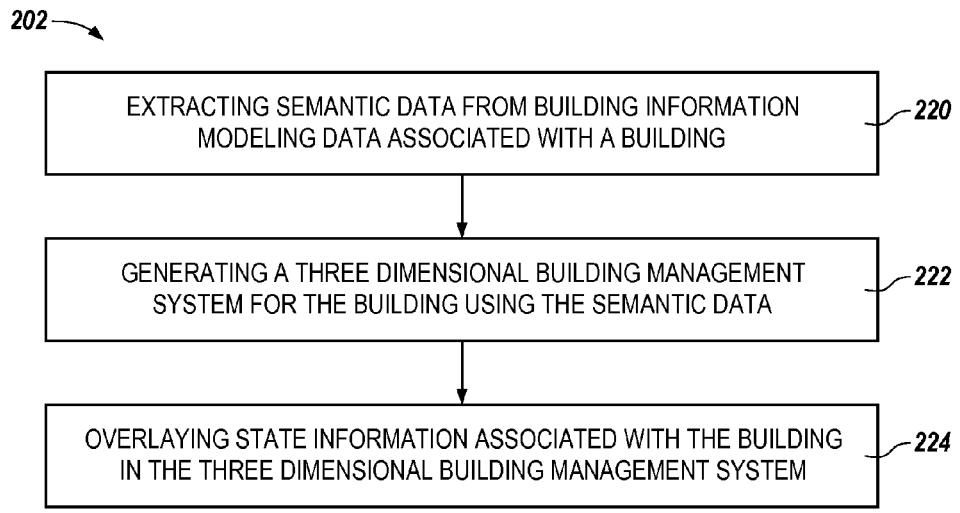
FIG. 2 illustrates a method for generating a three dimensional building management system in accordance with one or more embodiments of the present disclosure.

FIG. 2 illustrates a method 202 for generating a three dimensional (3D) building management system in accordance with one or more embodiments of the present disclosure. Method 100 can be performed by a computing device, such as, for instance, a laptop computer, a desktop computer, or a mobile device (e.g., a mobile phone, a smart phone, a personal digital assistant, etc.), among other types of computing devices. For example, method 202 can be performed by system 304 described in connection with FIG. 3.

At block 220 method 202 includes extracting semantic data from building information modeling (BIM) data associated with a building. The BIM data associated with the building can include data associated with the components (e.g., control components), equipment, devices, networks (e.g., control networks), areas, spaces, and/or properties of the building, in a manner analogous to the BIM data previously described in connection with FIG. 1. The semantic data extracted from the BIM data can include, for example, taxonomy, hierarchy, and/or topology data from the BIM data (e.g., taxonomy, hierarchy, and/or topology data associated with the components, equipment, devices, networks, areas, spaces, and/or properties of the building).

At block 222, method 202 includes generating a 3D building management system for the building using the semantic data. The 3D building management system for the building can include, for example, a 3D operational user interface that includes, for example, the floor plan of the building, with additional real time information about the building overlaid on the floor plan, and the 3D building management system for the building can be provided to a user on a display of a computing device of the user, in a manner analogous to the 3D building management system previously described in connection with FIG. 1.

As an example, the 3D building management system for the building can be generated by applying a number of display rules to the semantic data. Examples of the display rules, and application of the display rules to the semantic data, will be further described herein (e.g., in connection with FIG. 3).

At block 224, method 202 includes overlaying state information associated with the building in the 3D building management system. The state information can include, for example, real time (e.g., current) and/or historical (e.g., previous) data from a number of systems of the building, such as, for instance, HVAC, fire, access control, and/or video surveillance systems of the building, among other systems. Such data can include, for instance, temperature, humidity, occupancy, energy consumption, maintenance, and/or alarm data, among other types of data. Further, the state information can be associated with (e.g., relevant to)

the objects (e.g., the components, equipment, devices, networks, areas, spaces, and/or properties) of the building included (e.g., displayed) in the 3D building management system.

Figure 3:
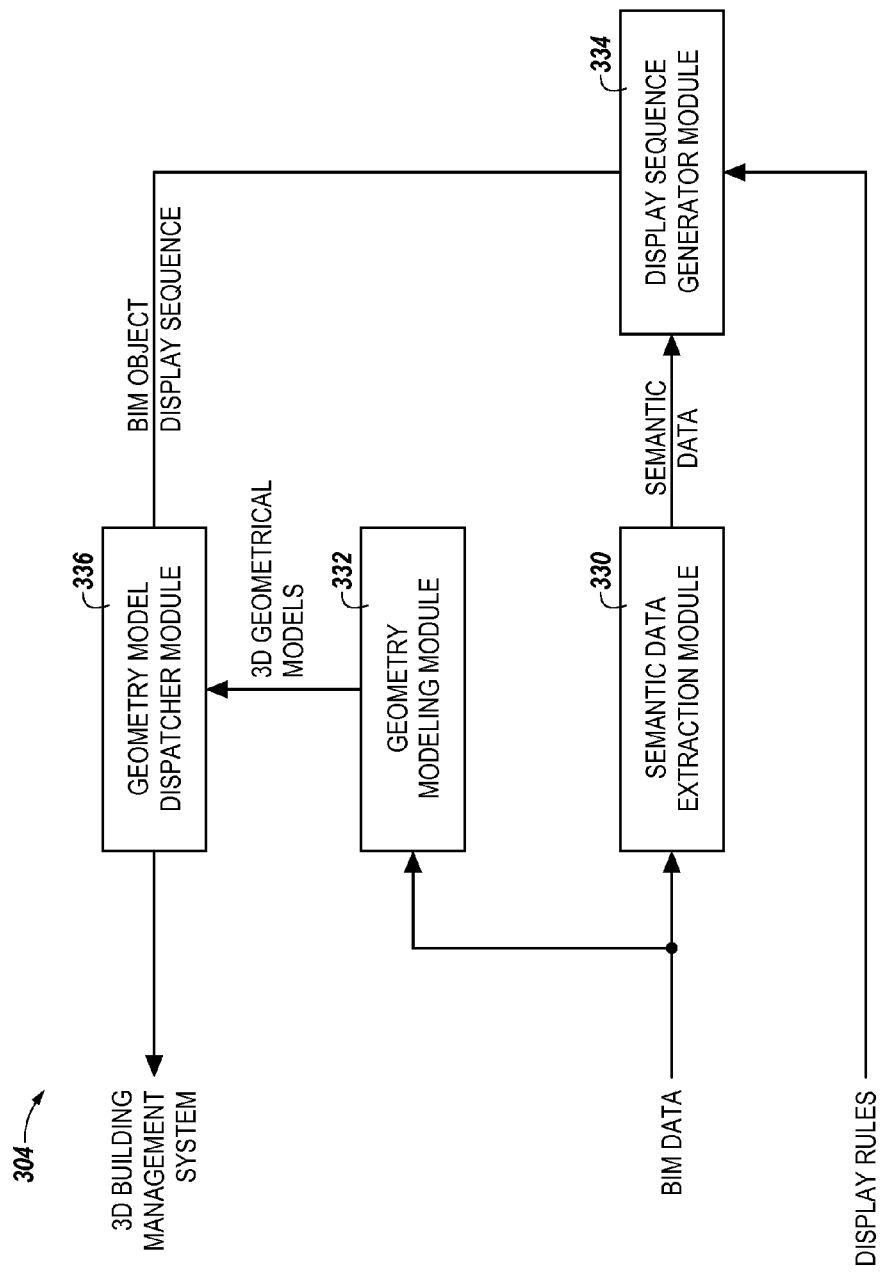
FIG. 3 illustrates a system for generating a three dimensional building management system in accordance with one or more embodiments of the present disclosure.

FIG. 3 illustrates a system 304 for generating a three dimensional (3D) building management system in accordance with one or more embodiments of the present disclosure. System 304 can be part of a computing device such as, for instance, a laptop computer, a desktop computer, or a mobile device (e.g., a mobile phone, a smart phone, a personal digital assistant, etc.), among other types of computing devices.

Although not shown in FIG. 3 for clarity and so as not to obscure embodiments of the present disclosure, the computing device (e.g., system 304) can include a memory and a processor coupled to the memory. The memory can be any type of storage medium that can be accessed by the processor to perform various examples of the present disclosure. For example, the memory can be a non-transitory computer readable medium having computer readable instructions (e.g., computer program instructions) stored thereon that are executable by the processor to perform various examples of the present disclosure.

The memory can be volatile or nonvolatile memory. The memory can also be removable (e.g., portable) memory, or non-removable (e.g., internal) memory. For example, the memory can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical disk storage, and/or a magnetic medium such as magnetic cassettes, tapes, or disks, among other types of memory. Further, the memory can be located in the computing device, or internal to another computing resource (e.g., enabling computer readable instructions to be downloaded over the Internet or another wired or wireless connection).

As shown in FIG. 3, system 304 includes a semantic data extraction module 330. As used herein, a "module" can include computer readable instructions that can be executed by a processor to perform a particular function. A module can also include hardware, firmware, and/or logic that can perform a particular function.

Semantic data extraction module 330 can extract semantic data from building information modeling (BIM) data associated with a building. The BIM data associated with the building can include data associated with the components, equipment, devices, networks, areas, spaces, and/or properties of the building, in a manner analogous to the BIM data previously described in connection with FIGS. 1 and 2. The semantic data extracted from the BIM data can include, for example, taxonomy, hierarchy, and/or topology data from the BIM data, in a manner analogous to the semantic data previously described in connection with FIG. 2.

As shown in FIG. 3, system 304 includes a geometry modeling module 332. Geometry modeling module 332 can generate a number of 3D geometrical models of the building based on the BIM data associated with the building. Each of the number of 3D geometrical models can have a different fidelity. That is, each of the number of 3D geometrical models can reproduce the building to (e.g., show the building at) different degrees and/or levels of detail and/or accuracy. For example, one of the 3D geometrical models may include only the outside of the building, another one of the 3D geometrical models may include the floor plan for one of the floors of the building, etc.

As shown in FIG. 3, system 304 includes a display sequence generator module 334. Display sequence generator module 334 can generate a sequence for displaying BIM objects associated with the building by applying a number of display rules to the semantic data extracted by semantic data extraction module 330. The number of display rules can be set (e.g., pre-set) by a user (e.g., operator), and can be based on the user's preferences for the building management system. Further, the number of display rules can be configurable based on the user's task. As an example, if the user wants to view the HVAC system of the building, the display rules may hide the IFC Covering of the building. Accordingly, the building management system can include (e.g., display to the user) the information about the building that is relevant to the user.

The number of display rules can include priority rules that prioritize the display sequence of the BIM objects. That is, the BIM objects (e.g., 3D models of the BIM objects) can be put in the display sequence according to their priorities, and the BIM object having the highest priority (e.g., the BIM object at the head of the display sequence) can be displayed first, with the remaining BIM objects then subsequently displayed according to their decreasing priorities (e.g., according to their descending order in the display sequence).

As an example, the number of display rules can include a taxonomy priority rule that prioritizes the display sequence of the BIM objects based on the taxonomy of the BIM objects (e.g., the BIM object display sequence is generated according to the taxomony of the BIM objects). As an example, an Industry Foundation Class (IFC) Slab and IFC Roof may have a greater display priority than an IFC Wall, IFC Column, and IFC Beam, which may have a greater display priority than an IFC Window and IFC Door (e.g., the IFC Slab and IFC Roof may be displayed first, then the IFC Wall, IFC Column, and IFC beam may be displayed, and then finally the IFC Window and IFC Door may be displayed) in increasing order of design density and/or importance.

As an additional example, the number of display rules can include a hierarchy priority rule that prioritizes the display sequence of the BIM objects based on the hierarchy (e.g., the geometrical hierarchy) of the BIM objects (e.g., the BIM object display sequence is generated according to the hierarchy of the BIM objects). As an example, lower stories of the building may have a greater display priority than higher stories of the building (e.g., the first story of the building may be displayed first, then the second story of the building may be displayed, then the third story, etc.).

As an additional example, the number of display rules can include a region of interest display rule that displays all the BIM objects associated with a particular region of interest. A region of interest display rule can be, for example, geometry based (e.g., the particular region of interest can be a geometry based region). For instance, a geometry based region of interest display rule can highlight all BIM objects within a particular distance (e.g., 10 meters). As an additional example, a region of interest display rule can be topology based (e.g., the particular region of interest can be a topology based region). For instance, a topology based region of interest display rule can highlight all of a particular type of BIM object having a particular characteristic (e.g., all diffusers down from a VAV, or all diffusers in a particular space). Further, a region of interest display rule can be based on (e.g., tied to) user privileges to automatically restrict the user's view to only those BIM objects that the user is allowed to view and/or control.

As an additional example, the number of display rules can include a state visualization display rule that displays all the BIM objects that are in a particular state. A state visualization display rule can be, for example, temperature based (e.g., the particular state can be a particular temperature state). For instance, a temperature based region of interest display rule can highlight all BIM objects that are at or above a particular temperature.

In some embodiments, display sequence generator module 334 can adopt a placeholder for each of the BIM objects in the generated sequence. The placeholder for each of the BIM objects in the sequence can have a number of different fidelities (e.g., different degrees and/or levels of detail and/or accuracy of that BIM object). For instance, the simplest (e.g., lowest) fidelity can be a boundary box of the BIM object, such as IFC Furniture, IFC Proxy, etc.

Display sequence generator module 334 can set the fidelity of the placeholder for each of the BIM objects using a fidelity parameter. Display sequence generator module 334 can then subsequently adjust the fidelity setting of the placeholder for each of the BIM objects based on (e.g., after evaluating) the performance of system 304. For instance, if there is a scarcity of computing resources needed to generate the 3D building management system, display sequence generator module 334 can trade off between the number of BIM objects in the sequence and the fidelity of the placeholders for the BIM objects in the sequence.

In some embodiments, the BIM objects in the generated sequence may include BIM objects of a number of different types, such as walls (e.g., IFC Wall), VAVs (e.g., IFC VAV), duct networks, etc. In such embodiments, a different display mode can be applied to (e.g., used to display) each of the different types of BIM objects (e.g., the same display mode can be applied to all BIM objects of the same type). As an example, if the BIM objects in the sequence include walls and a duct network, a display mode that highlights the duct network in the display can be applied to the duct network and/or a display mode that weakens the walls in the display can be applied to the walls. Examples of different display modes will be further described herein.

In some embodiments, the BIM objects in the generated sequence may include BIM objects in a number of different hierarchies, such as stories (e.g., IFC Story), zones (e.g., IFC Zone), spaces (e.g., IFC Space), etc. In such embodiments, a different display mode can be applied to (e.g., used to display) the BIM objects in each of the different hierarchies (e.g., the same display mode can be applied to all BIM objects in the same hierarchy).

The different display modes for the BIM objects can include, for example, a shaded mode (e.g., the BIM object is shaded in), a shaded with edges mode (e.g., the BIM object is shaded in and the edges of the BIM object are shown using lines), transparent mode (e.g., the BIM object is shown as transparent), transparent with edges mode (e.g., the BIM object is shown as transparent and the edges of the BIM object are shown using lines), edges only mode (e.g., only the edges of the BIM object are shown using lines), and/or hidden lines mode (e.g., only the visible edges of the BIM object are shown using lines). However, embodiments of the present disclosure are not limited to these examples of display modes.

As shown in FIG. 3, system 304 includes a geometry model dispatcher module 336. Geometry model dispatcher module 336 can generate a 3D building management system for the building using one of the number of 3D geometrical models generated by geometry modeling module 332 and the sequence for displaying the BIM objects generated by display sequence generator module 334. Geometry model dispatcher module 336 can set the fidelity of the 3D geometrical model used to generate the 3D building management system based on the resource constraints (e.g., frame rate, network bandwidth, screen size, etc.) of a device (e.g., a computing device of the user) on which the 3D building management system is to be displayed.

System 304 can send (e.g., transmit) the 3D building management system generated by geometry model dispatcher module 336 to a computing device (e.g., a laptop computer, a desktop computer, or a mobile device) of the user via a network (not shown in FIG. 3), and the 3D building management system can be provided (e.g., displayed and/or presented) to the user on a display (e.g., screen) of the computing device. The network can be, for example, a wide area network (WAN) such as the Internet, a local area network (LAN), a personal area network (PAN), a campus area network (CAN), or metropolitan area network (MAN), among other types of networks.

As used herein, a "network" can provide a communication system that directly or indirectly links two or more computers and/or peripheral devices and allows users to access resources on other computing devices and exchange messages with other users. A network can allow users to share resources on their own systems with other network users and to access information on centrally located systems or on systems that are located at remote locations.

A network may provide connections to the Internet and/or to the networks of other entities (e.g., organizations, institutions, etc.). Users may interact with network-enabled software applications to make a network request, such as to get a file or print on a network printer. Applications may also communicate with network management software, which can interact with network hardware to transmit information between devices on the network.

Although some embodiments of the present disclosure have been described in connection with IFC, the leading public standard BIM representation, embodiments of the present disclosure are not limited to processing or producing IFC-based information. For example, embodiments of the present disclosure can be applied to BIM models produced by other commercial applications, or serialized in other formats.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for generating a three dimensional building management system, comprising:
   inputting, into a three dimensional graphics rendering engine, building information modeling data associated with a building;
   inputting, into the three dimensional graphics rendering engine, real time building management system data associated with the building, wherein the real time building management system data associated with the building includes a current operating state of a number of components of the building that changes over time; and
   generating, by the three dimensional graphics rendering engine, a three dimensional building management system for the building based on the building information modeling data and the real time building management system data, wherein generating the three dimensional building management system includes:
      generating, by the three dimensional graphics rendering engine, a three dimensional surface from the building information modeling data;
      extracting, by the three dimensional graphics rendering engine, the number of components of the building, and static data associated with the number of components that does not change over time, from the building information modeling data;
      binding, by the three dimensional graphics rendering engine, each of the number of components of the building, and the static data associated with the number of components, to a corresponding building management system representation of that respective component;
      updating, by the three dimensional graphics rendering engine, the number of components of the building based on the real time building management system data;
      predicting, by the three dimensional graphics rendering engine, a sequence of future events associated with abnormal conditions in the number of components of the building using the real time building management system data and
      displaying, by the three dimensional graphics rendering engine, the predicted sequence of future events.

2. The method of claim 1, wherein the method includes:
   transposing the building information modeling data into a standardized format associated with the three dimensional graphics rendering engine; and
   inputting the transposed building information modeling data into the three dimensional graphics rendering engine.

3. The method of claim 1, wherein generating the three dimensional building management system includes:
   binding, by the three dimensional graphics rendering engine, the three dimensional surface to the building management system representations of the number of components of the building.

4. The method of claim 1, wherein generating the three dimensional building management system includes modeling, by the three dimensional graphics rendering engine, real world causes and effects of the abnormal conditions in the number of components of the building using the real time building management system data.

5. The method of claim 1, wherein:
   the building information modeling data is static data; and
   the real time building management system data is dynamic data.

\* \* \* \* \*